United States Patent [19]

Buck

[11] Patent Number: 5,037,516
[45] Date of Patent: Aug. 6, 1991

[54] PROCESS TO APPLY A MOS2 COATING ON A SUBSTRATE

[75] Inventor: Volker Buck, Stuttgart, Fed. Rep. of Germany

[73] Assignee: Deutsche Forschungsanstalt für luft- und Raumfahrt e.V., Cologne, Fed. Rep. of Germany

[21] Appl. No.: 98,774

[22] Filed: Sep. 18, 1987

Related U.S. Application Data

[63] Continuation of Ser. No. 859,467, May 5, 1986, abandoned.

[30] Foreign Application Priority Data

May 10, 1985 [DE] Fed. Rep. of Germany ....... 3516933

[51] Int. Cl.[5] ............................................. C23C 14/34
[52] U.S. Cl. ........................... 204/192.15; 204/192.16
[58] Field of Search ...................... 204/192.15, 192.16, 204/192.22

[56] References Cited

U.S. PATENT DOCUMENTS 4,324,803 4/1982 Bergmann et al. ......... 204/192 C X
4,415,419 11/1983 Niederhaeuser et al. ........... 204/192

OTHER PUBLICATIONS

Andersson et al., "3.5 Morphologies . . . lubricants", Vacuum, vol. 27, No. 4, 1977, pp. 379-382.
R. Christy, "Sputtered MoS2. . . Improvements", Thin Solid Films, 73 (1980), pp. 299-307.
B. Stupp, "Synergistic . . . MoS2", Thin Solid Films, 84 (1981), pp. 257-266.
ASLE Proceedings—Denver, Colorado, Aug. 7-10, 1984, pp. 201-207 and pp. 223-229.
Morphological Properties of Sputtered MoS2 Films WEAR 91 (1983), pp. 281-288.

Primary Examiner—Nam X. Nguyen
Attorney, Agent, or Firm—Wolf, Greenfield & Sacks

[57] ABSTRACT

In a process for application of a MoS2 coating on a substrate in which, within a sputter chamber, molybdenum disulfide is released in a gas discharge from a molybdenum disulfide target and deposited onto the substrate, in order to produce a lamella structure extending parallel to the surface of the substrate, it is proposed that the water vapor partial pressure in the sputter chamber is reduced to such an extent that the ratio of the water vapor partial pressure to the coating rate of the substrate falls below a prescribed value.

5 Claims, 1 Drawing Sheet

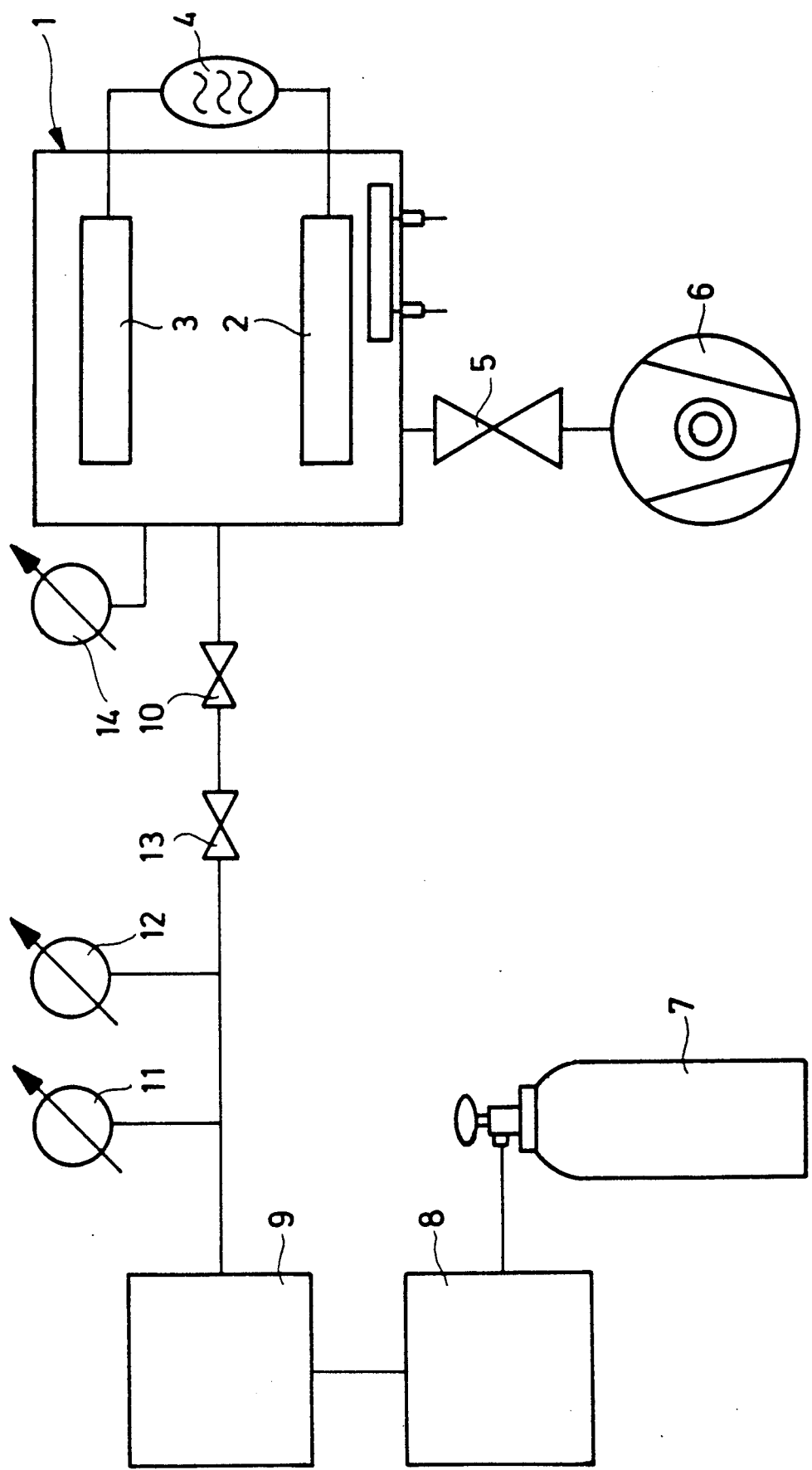

PROCESS TO APPLY A MOS$_2$ COATING ON A SUBSTRATE

DESCRIPTION

This is a continuation of Ser. No. 859467 filed 5-5-86, abd.

The invention relates to a process for application of a MoS$_2$ coating on a substrate, in which, within a sputter chamber, MoS$_2$ molecules are released in a gas discharge from an MoS$_2$ target, and precipitated (sputtered) onto the substrate.

Molybdenum disulfide sputter coatings can be utilized as solid lubricants, and are applied extensively particularly in aerospace applications, since these lubricant coatings can be used in the vacuum of space, where the use of liquid lubricants (oils) is unfavorable, due to their creep characteristics.

Of substantial importance is the oxidation resistance of molybdenum disulfide lubricated parts. Molybdenum disulfide sputter coatings oxidize on contact with moisture, so that in aerospace applications, costly protective measures are necessary, e.g. purging with dry nitrogen, as long as these molybdenum disulfide coatings are within the earth's atmosphere.

Molybdenum disulfide sputter coatings on the coated surface normally constitute lamellae whose orientation extends essentially perpendicular to the substrate surface. There thus results a greater surface, and thus a higher incidence of oxidation upon contact with moisture. In the past, these lamellae oriented essentially perpendicular to the substrate surface have been reoriented by mechanical treatment, e.g. by wiping, so that the lamellae, at least in the upper region, extend essentially parallel to the substrate surface. (ASLE Proceedings, Denver, Colo., 7-10 August 1984, Presentation of Spalvins, pages 201-207; Wear, 91(1983), Article by Buck, pages 281-288) With this process, however, the lamellae as a rule break away easily. In addition, with this method, the large surface is only slightly diminished in any event, so that in corrosive media a large attack surface is still present.

The manufacture of lamellae extending parallel to the surface by sputtering has to date been achieved in only one case, by the use of a very particular target of molybdenum disulfide, with the cause of the occurrence of this favorable coating form to date remaining unknown (ASLE Proceedings, Denver, Colo., 7-10 August 1984, Presentation of Fleischauer et al., pages 223-229.)

It is the task of the invention to improve the known sputter processes for coating of a substrate with a molybdenum disulfide sputter coating, in such a way that with arbitrary targets, a surface-parallel orientation of the lamellae is produced.

This task is accomplished with a process of the kind described at the outset, in that the partial pressure of water vapor in the sputter chamber is so greatly reduced that the ratio of the water vapor partial pressure to the coating rate of the substrate remains below a prescribed value.

This value is astonishingly small, that is, it has been found that an extraordinarily small water vapor partial pressure must be achieved. Preferably, the prescribed ratio lies at $10^{-7}$ mbar/1.6 mg m$^2$s$^{-1}$ or below (water vapor pressure/MoS$_2$ deposition rate).

It is not yet clear why even small water vapor partial pressures in the sputter chamber prevent a surface-parallel arrangement of the molybdenum disulfide lamellae, however the cause may be that even a slight oxidation of the molybdenum disulfide, because of the altered molecular dimensions, leads to the undesired orientation perpendicular to the substrate surface.

It has been found, surprisingly, that only by a very thorough reduction of the water vapor partial pressure this undesired change in orientation of the lamellae can prevented, so that reproducible surface-parallel lamella structures can be formed.

For reduction of the water vapor partial pressure, it is advantageous for the sputter chamber to be heated before the sputtering.

It is also possible, before the sputtering, to evacuate the sputter chamber of water vapor with a high powered pump, with the evacuation continuing over a relatively long time (e.g. several hours).

Furthermore, in connection with the present process, it is recommended that the sputter chamber be loaded through a vacuum lock, so that undesired contact with the water-vapor-containing environment is largely excluded.

It is also advantageous, if the gas discharge required for the sputtering is conducted with a moderate power level, which, while it delivers a satisfactory sputter rate, does not engender excessive water desorption at the target. It has been found that with an increased power of the gas discharge, not only more molybdenum disulfide particles are released from the target, but also more water molecules, with the release of water molecules increasing faster with increased discharge power, than the number of released molybdenum disulfide particles. Thus the water vapor content arising by desorption is smaller at lower discharge powers; however, the discharge power must not be selected to be so low that an insufficient sputter rate is produced. However, it is important that the discharge power not be chosen to be too high, and that thus the sputter process is extended over a relatively long period of time.

Furthermore, the water vapor partial pressure in the sputter chamber can be held low by using as a discharge gas a gas carefully freed of water vapor, for example argon, which has been passed through a molecular filter and a getter furnace.

BRIEF DESCRIPTION OF THE DRAWINGS

The following description of preferred forms of embodiment of the invention, together with the diagrams, serves for clarification. The drawings represent schematically an apparatus for performance of the sputter process.

In a sputter chamber 1 enclosed on all sides, the part to be coated, hereafter termed the substrate 2, and the molybdenum disulfide coating material, hereafter termed the target 3, are arranged opposite each other, for example with a separation of 4 cm. The target can be a compact disc of molybdenum disulfide with a diameter of 20 cm, having dimensions similar to the substrate to be coated.

The substrate and the target constitute electrodes for a gas discharge, and for this purpose are each connected to an alternating current voltage source 4.

For evacuation of the sputter chamber 1, it is connected through a valve 5 to a pump 6, preferably constituted by a high vacuum turbopump, in particular a high vacuum for water vapor.

As a discharge gas in the represented example of embodiment, argon is used, which is conducted from a supply flask 7 through a molecular filter 8 and a getter furnace 9, through a valve 10 into the sputter chamber 1. Between the getter furnace 9 and the valve 10, there is also placed a flow meter 11, a moisture meter 12, and a dosing valve 13. The molecular filter and getter furnace serve for purification of the argon, particularly the removal of water vapor, so that argon gas with an extraordinarily low water content can be introduced into the sputter chamber.

The water vapor content within the sputter chamber can be determined by means of a partial pressure analyzer 14, preferably by means of a mass spectrometer.

In operation, after loading of the sputter chamber, preferably through a vacuum lock, not represented in the drawing, the sputter chamber is evacuated for a relatively long time by means of the pump 6, and also heated. In operation, the pressure of the argon in the sputter chamber is for example 20 $\mu$bar, and the water vapor partial pressure can be for example at $5 \times 10^{-9}$ mbar.

The gas discharge can be driven, for example, with a power of 750W, so that overall there results a coating rate in which the ratio of the water vapor partial pressure to the coating rate lies at the order of magnitude of $10^7$ mbar/1.6 mg m$^{-2}$s$^{-1}$.

It has been found that upon performance of the process with the indicated low water vapor partial pressures, reproducible coating structures can be achieved, in which the lamellae are formed surface-parallel to the substrate surface, and not perpendicular to it. Because of the substantially smaller surface which the lamellae offer to the environment, the oxidation resistance of such molybdenum disulfide coatings is substantially greater than that of coatings with lamellae oriented perpendicular to the substrate surface.

I claim:

1. In a process for application of a molybdenum disulfide coating to a substrate, in which, within a sputter chamber, molybdenum disulfide is released from a molybdenum disulfide target in a gas discharge, and precipitated onto the substrate, the improvement comprising reducing the water vapor partial pressure in the sputter chamber so that the ratio of the water vapor partial pressure to the coating rate of the substrate is at or below $10^{-7}$ mbar/1.6 mg m$^{-2}$s$^{-1}$ whereby the molybdenum disulfide coating is characterized by its lamellae being oriented parallel to said substrate.

2. Process according to claim 1, unique in that for reduction of the water vapor partial pressure, before the sputtering, the sputter chamber or parts of it are heated.

3. Process according to claim 1, unique in that for reduction of the water vapor partial pressure the sputter chamber is evacuated with a high pump capacity for water vapor.

4. Process according to claim 1, unique in that for reduction of the water vapor partial pressure, the sputter chamber is loaded through a vacuum lock.

5. Process according to claim 1, unique in that for reduction of the water vapor partial pressure, a gas carefully freed of water vapor is used as the discharge gas.

* * * * *